United States Patent
Hasegawa

(10) Patent No.: US 7,834,642 B2
(45) Date of Patent: Nov. 16, 2010

(54) TESTING APPARATUS AND METHOD WHICH ADJUSTS A PHASE DIFFERENCE BETWEEN RISING AND FALLING SIGNALS OUTPUT FROM A DUT

(75) Inventor: Takashi Hasegawa, Tokyo (JP)

(73) Assignee: Advantest Corporation, Tokyo (JP)

( * ) Notice: Subject to any disclaimer, the term of this patent is extended or adjusted under 35 U.S.C. 154(b) by 437 days.

(21) Appl. No.: 11/852,334

(22) Filed: Sep. 10, 2007

(65) Prior Publication Data

US 2008/0218179 A1  Sep. 11, 2008

Related U.S. Application Data

(63) Continuation of application No. PCT/JP2006/308041, filed on Apr. 17, 2006.

(30) Foreign Application Priority Data

Apr. 28, 2005  (JP)  ............... 2005-133250

(51) Int. Cl.
  G01R 27/28 (2006.01)
  G01R 31/26 (2006.01)
  G11B 27/00 (2006.01)
  G01R 31/28 (2006.01)

(52) U.S. Cl. ............... 324/617; 324/765; 714/814; 714/724

(58) Field of Classification Search ............... 324/617; 714/814
See application file for complete search history.

(56) References Cited

U.S. PATENT DOCUMENTS

| | | | |
|---|---|---|---|
| 3,431,490 A | | 3/1969 | Kwap et al. |
| 3,778,714 A | | 12/1973 | McHenry III |
| 5,673,271 A | | 9/1997 | Ohsawa |
| 6,327,678 B1 | * | 12/2001 | Nagai ............... 714/700 |
| 6,865,698 B2 | * | 3/2005 | Housako ............... 714/700 |
| 7,196,534 B2 | * | 3/2007 | Oshima ............... 324/765 |

(Continued)

FOREIGN PATENT DOCUMENTS

DE  19915398  10/1999

(Continued)

Primary Examiner—Jeff Natalini
(74) Attorney, Agent, or Firm—Jianq Chyun IP Office

(57) ABSTRACT

A test apparatus for testing a device under test includes a first timing comparator obtaining a device output signal output from the device under test at a timing designated by a first strobe signal, a second timing comparator obtaining the device output signal at a timing designated by a second strobe signal supplied later than the first strobe signal, a preceding edge judging circuit, when rising and falling signals are input at the same timing as the device output signal, judging which one of the rising and falling signals arrives at the first and second timing comparators at an earlier timing, a preceding edge detecting circuit adjusting a timing at which the first strobe signal is supplied so that the first timing comparator obtains, at a timing of a rising or falling edge, one of the rising and falling signals which is judged to arrive earlier, and a following edge detecting circuit adjusting a timing at which the second strobe signal is supplied so that the second timing comparator obtains, at a timing of a rising or falling edge, one of the rising and falling signals which is judged to arrive later.

13 Claims, 8 Drawing Sheets

U.S. PATENT DOCUMENTS

| | | | |
|---|---|---|---|
| 7,404,114 B2 * | 7/2008 | Cranford et al. | 714/715 |
| 7,512,872 B2 * | 3/2009 | Awaji et al. | 714/814 |
| 2008/0016422 A1 * | 1/2008 | Ochi | 714/735 |
| 2008/0218179 A1 * | 9/2008 | Hasegawa | 324/617 |

FOREIGN PATENT DOCUMENTS

| | | |
|---|---|---|
| DE | 10132241 | 4/2002 |
| JP | 05-019018 | 1/1993 |
| JP | 07-074601 | 3/1995 |
| JP | 08-062301 | 3/1996 |
| JP | 2000-314764 | 11/2000 |
| WO | 02/101404 | 12/2002 |

* cited by examiner

- Prior Art -

TESTING APPARATUS AND METHOD WHICH ADJUSTS A PHASE DIFFERENCE BETWEEN RISING AND FALLING SIGNALS OUTPUT FROM A DUT

CROSS REFERENCE TO RELATED APPLICATION

This is a continuation application of PCT/JP2006/308041 filed on Apr. 17, 2006 which claims priority from a Japanese Patent Application(s) NO. 2005-133250 filed on Apr. 28, 2005, the contents of which are incorporated herein by reference.

BACKGROUND

1. Technical Field

The present invention relates to a test apparatus and a test method. More particularly, the present invention relates to a test apparatus and a test method which adjust a phase difference, between rising and falling signals output from a device under test (DUT), which is caused during transmission of the signals and then obtains the adjusted rising and falling signals. The present application relates to the following Japanese Patent Application.

2. Related Art

FIG. 8 illustrates an exemplary configuration of a test apparatus 10 for testing a device under test (DUT) 400. The test apparatus 10 is disclosed in, for example, Patent Document 1. The test apparatus 10 inputs, into the DUT 400, a test signal which is generated based on a test pattern for testing the DUT 400, and judges whether the DUT 400 passes or fails a test based on an output signal which is output from the DUT 400 in response to the input test signal.

The test apparatus 10 includes therein a period generator 410, a pattern generator 430, a timing generator 420, a waveform shaper 440, a driver 450, a comparator 460, a timing comparing section 470, and a logic comparing section 480. The period generator 410 generates a reference clock which is used as a reference for the operations of the test apparatus 10, based on timing data designated by the pattern generator 430. The period generator 410 also generates a periodic clock which indicates the execution cycle of a test program in accordance with an instruction issued by the pattern generator 430, and supplies the generated periodic clock to the pattern generator 430.

The pattern generator 430 executes a sequence of a test program designated by a user of the test apparatus 10, and generates a test pattern to be supplied to the DUT 400 at each test period that is designated by the periodic clock. The pattern generator 430 also generates an expected value for the output signal that is output from the DUT 400, and supplies the generated expected value to the logic comparing section 480. The timing generator 420 generates, for each test period, a timing of supplying a test signal generated in accordance with a test pattern.

The waveform shaper 440 is a waveform formatter which receives the test pattern from the pattern generator 430, shapes a waveform, and outputs a test signal based on the timing received from the timing generator 420. In other words, the waveform shaper 440 outputs a signal having a waveform designated by the test pattern to the driver 450 at the timing designated by the timing generator 420, for example. The driver 450 supplies the test signal received from the waveform shaper 440 to the DUT 400.

The comparator 460 receives a device output signal output from the DUT 400, and detects whether the device output signal corresponds to the logical value H or L based on the voltage level of the device output signal. The timing comparing section 470 obtains the logical value of the device output signal which is output from the comparator 460 at a designated timing, and outputs the obtained result to the logic comparing section 480. In this way, the timing comparing section 470 outputs, to the timing comparing section 470, a timing comparison result which is obtained by comparing the varying timing of the waveform of the device output signal with the designated timing. The logic comparing section 480 compares the output from the timing comparing section 470 with the expected value. In the above-described manner, the test apparatus 10 can judge whether the DUT 400 passes or fails the test.

[Patent Document 1] Unexamined Japanese Patent Application Publication No. H08-62301

When the test apparatus 10 judges whether the DUT 400 itself passes or fails the test, the timing comparing section 470 is required to obtain, at the same timing, the signals that are all output at the same timing from a plurality of output terminals of the DUT 400. Even though the DUT 400 outputs the signals at the same timing, however, the signals arrive at the timing comparing section 470 at different timings due to various factors including a variance, among the output terminals, in terms of the path length from the DUT 400 to the timing comparing section 470. Therefore, the timing comparing section 470 needs to absorb the variance in timing.

Similarly, the path length between the DUT 400 and timing comparing section 470 or the logical elements cause a difference between a time from when the DUT 400 outputs a rising signal to when the rising signal arrives at the timing comparing section 470 and a time from when the DUT 400 outputs a falling signal to when the falling signal arrives at the timing comparing section 470. Therefore, the timing comparing section 470 needs to perform a timing adjusting operation so as to be capable of obtaining, at the same timing, the rising and falling signals that are output from the DUT 400 at the same timing.

SUMMARY

Therefore, it is an object of an aspect of the present invention to provide a test apparatus and a test method, which are capable of overcoming the above drawbacks accompanying the related art. The above and other objects can be achieved by combinations described in the independent claims. The dependent claims define further advantageous and exemplary combinations of the present invention.

According to an aspect related to the innovations herein, one exemplary test apparatus may include a test apparatus for testing a device under test. The test apparatus includes a first timing comparator that obtains a device output signal output from the device under test at a tiring designated by a first strobe signal, a second timing comparator that obtains the device output signal at a timing designated by a second strobe signal, wherein the second strobe signal is supplied later than the first strobe signal, a preceding edge judging circuit that, when a rising signal and a falling signal are input at the same timing as the device output signal, judges which one of the rising and falling signals arrives at the first and second timing comparators at an earlier timing, a preceding edge detecting circuit that adjusts a timing at which the first strobe signal is supplied so that the first timing comparator obtains, at a timing of a rising or falling edge, one of the rising and falling signals which is judged to arrive earlier, and a following edge detecting circuit that adjusts a timing at which the second strobe signal is supplied so that the second timing comparator obtains, at a timing of a rising or falling edge, one of the rising and falling signals which is judged to arrive later.

According to an aspect related to the innovations herein, one exemplary test method may include a test method for testing a device under test. The test method includes obtaining a device output signal output from the device under test at a first timing designated by a first strobe signal, obtaining the device output signal at a second timing designated by a second strobe signal, wherein the second strobe signal is supplied later than the first strobe signal, when a rising signal and a falling signal are input at the same timing as the device output signal, judging which one of the rising and falling signals arrives at the first and second timing comparators at an earlier timing, adjusting the first timing designated by the first strobe signal so that one of the rising and falling signals which is judged to arrive earlier is obtained at a timing of a rising or falling edge, and adjusting the second timing designated by the second strobe signal so that one of the rising and falling signals which is judged to arrive later is obtained at a timing of a rising or falling edge.

Here, all the necessary features of the present invention are not listed in the summary. The sub-combinations of the features may become the invention.

DESCRIPTION OF EXEMPLARY EMBODIMENT

Hereinafter, one aspect of the present invention will be described through an embodiment. The embodiment does not limit the invention according to the claims, and all the combinations of the features described in the embodiment are not necessarily essential to means provided by aspects of the invention.

Figure 1:
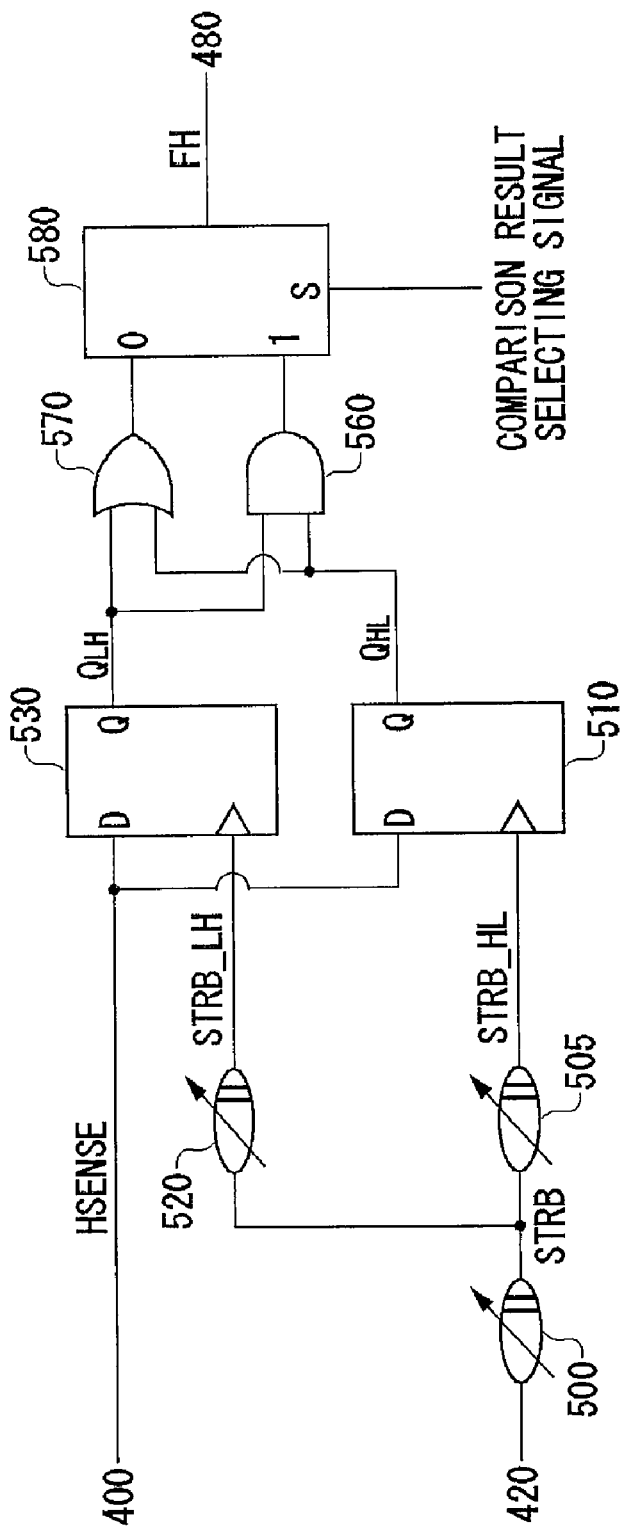
FIG. 1 illustrates an exemplary configuration of a timing comparing section 470.

FIG. 1 illustrates the configuration of the timing comparing section 470 which is designed to absorb a difference in timing between a rising signal and a falling signal. The timing comparing section 470 includes therein a common variable delay circuit 500, a falling-side variable delay circuit 505, a falling-side timing comparator 510, a rising-side variable delay circuit 520, a rising-side timing comparator 530, an AND gate 560, an OR gate 570, and a comparison result selecting circuit 580. The common variable delay circuit 500 outputs a common strobe signal STRB which is obtained by delaying, by a predetermined time, the pulse signal which is input thereinto from the timing generator 420 and used as a reference for timing comparison.

The falling-side variable delay circuit 505 outputs a falling-side strobe signal STRB_HL which is obtained by delaying the common strobe signal STRB by a predetermined time. The falling-side strobe signal STRB_HL is used to detect the falling edge of the device output signal. The falling-side timing comparator 510 receives via the comparator 460 the logical value HSENSE of the device output signal output from the DUT 400, and obtains the logical value HSENSE at a timing designated by the falling-side strobe signal STRB_HL.

The rising-side variable delay circuit 520 outputs a rising-side strobe signal STRB_LH which is obtained by delaying the common strobe signal STRB by a predetermined time. The rising-side strobe signal STRB_LH is used to detect the rising edge of the device output signal. The rising-side timing comparator 530 receives via the comparator 460 the logical value HSENSE of the device output signal output from the DUT 400, and obtains the logical value HSENSE at a timing designated by the rising-side strobe signal STRB_LH. The AND gate 560 outputs a logical AND between the outputs from the falling-side timing comparator 510 and rising-side timing comparator 530. The OR gate 570 outputs a logical OR between the outputs from the falling-side timing comparator 510 and rising-side timing comparator 530. The comparison result selecting circuit 580 outputs one of the outputs from the AND gate 560 and OR gate 570, in accordance with a comparison result selecting signal input thereto, as a timing comparison result FH for the device output signal HSENSE.

Here, the reference pulse signal received by the common variable delay circuit 500 is synchronized with the reference clock for the test apparatus 10. Therefore, the falling-side timing comparator 510 and rising-side timing comparator 530 can obtain device output signals that are output from the DUT 400 at the same timing with respect to the reference clock, after the elapse of a fixed amount of delay time which is determined by the common variable delay circuit 500, falling-side variable delay circuit 505 and rising-side variable delay circuit 520, unless the delay amounts of the common variable delay circuit 500, falling-side variable delay circuit 505 and rising-side variable delay circuit 520 are varied.

Figure 2A:
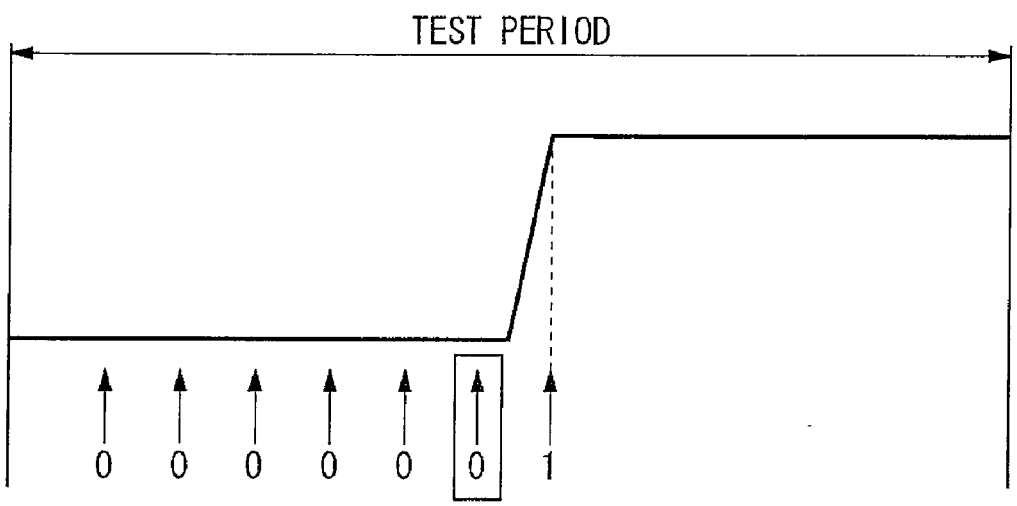
FIGS. 2A and 2B illustrate a delay amount adjusting method employed by the timing comparing section 470.
Figure 2B:
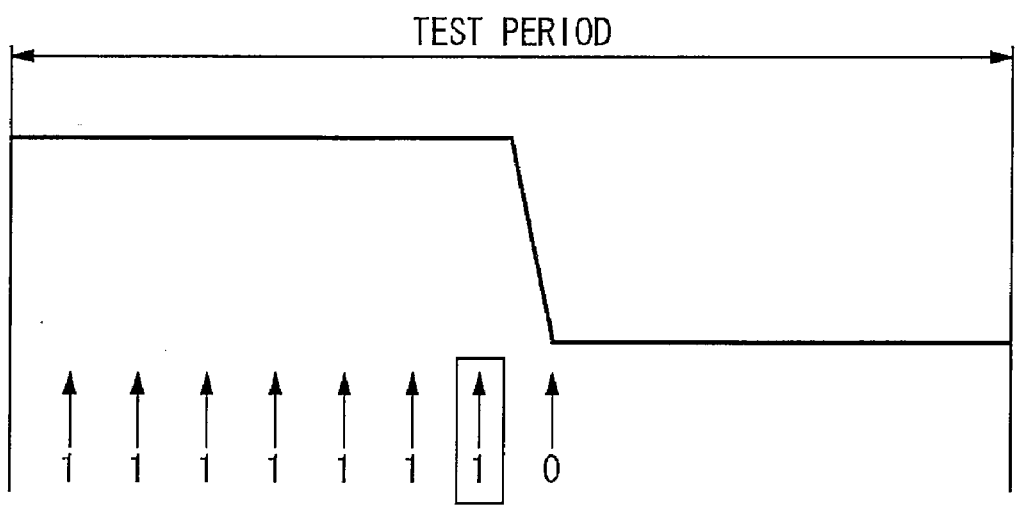

FIGS. 2A and 2B illustrate a delay amount adjusting method employed by the timing comparing section 470.

Prior to a test of the DUT 400, the test apparatus 10 adjusts, in advance, the timings at which the timing comparing section 470 obtains the rising and falling signals. This adjustment is performed in the following manner, for example.

To start with, the test apparatus 10 is configured in such a manner as to be capable of outputting the rising and falling signals at the same timing from contact points between the test apparatus 10 and the output terminals of the DUT 400. For example, the test apparatus 10 has a performance board for an adjustment use mounted therein, in place of a performance board on which the DUT 400 is provided. The performance board for an adjustment use is designed so that a signal output from any driver 450 is directly input into the comparator 460. Here, the test apparatus 10 determines the rising and falling timings of the signals output from the driver 450 so that the timings indicated by the rising and falling signals are observed the same at the contact points between the test apparatus 10 and the output terminals of the DUT 400. Alternatively, the test apparatus 10 may have a DUT 400 for an adjustment use mounted therein. The DUT 400 for an adjustment use can output the rising and falling signals at the same timing.

Subsequently, the test apparatus 10 adjusts the delay amounts of the rising-side variable delay circuit 520 and falling-side variable delay circuit 505 so as to be capable of obtaining at the same timing the rising and falling signals which are input thereto at the same timing via its contact points with the output terminals of the DUT 400. Which is to say, while receiving a reference rising signal for an adjustment use with the delay amount of the common variable delay circuit 500 being fixed, the test apparatus 10 adjusts the delay amount of the rising-side variable delay circuit 520 so that the rising-side timing comparator 530 can obtain the rising signal at its varying timing. To be more specific, the test apparatus 10 sets a reset input (not shown) of the falling-side timing comparator 510 at the logical value H so as to maintain the output QHL of the falling-side timing comparator 510 at the logical value L. Also in the test apparatus 10, the value of the comparison result selecting signal is set at zero so that the output from the OR gate 570 is output to the logic comparing section 480. Under these settings, the rising signal for an adjustment use is repeatedly input, while the delay amount of the rising-side variable delay circuit 520 is sequentially increased by a predetermined amount, as illustrated in FIG. 2A. Thus, the output from the comparison result selecting circuit 580 varies from the logical value L to the logical value H at the varying point of the rising signal. Based on this, the test apparatus 10 determines the delay amount of the rising-side variable delay circuit 520 so that the rising-side timing comparator 530 can obtain the device output signal at a timing immediately before or after the varying point of the rising signal.

Subsequently, while receiving a reference falling signal for an adjustment use with the delay amount of the common variable delay circuit 500 being fixed at the above-mentioned value, the test apparatus 10 adjusts the delay amount of the falling-side variable delay circuit 505 so that the falling-side timing comparator 510 can obtain the falling signal at the timing of its varying point. To be more specific, the test apparatus 10 sets a reset input (not shown) of the rising-side timing comparator 530 at the logical value H so as to maintain the output of the rising-side timing comparator 530 at the logical value L. Also in the test apparatus 10, the value of the comparison result selecting signal is set at zero so that the output from the OR gate 570 is output to the logic comparing section 480. Under these settings, the falling signal for an adjustment use is repeatedly input, while the delay amount of the rising-side variable delay circuit 520 is sequentially increased by a predetermined amount, as illustrated in FIG. 2B. Thus, the output from the comparison result selecting circuit 580 varies from the logical value H to the logical value L at the varying point of the falling signal. Based on this, the test apparatus 10 determines the delay amount of the falling-side variable delay circuit 505 so that the falling-side timing comparator 510 can obtain the device output signal at a timing immediately before or after the varying point of the falling signal.

Following this, the test apparatus 10 judges which one of the rising-side timing comparator 530 and falling-side timing comparator 510 obtains the device output signals at an earlier timing. In other words, the test apparatus 10 judges which one of the delay amount TpLH of the rising-side variable delay circuit 520 and the delay amount TpHL of the falling-side variable delay circuit 505 is smaller. Based on this judgment, the test apparatus 10 determines the value of the comparison result selecting signal which is to be used during a test. To be more specific, the test apparatus 10 receives a device output signal with the same waveform, that is to say, a rising signal, while the delay amounts of the rising-side variable delay circuit 520 and falling-side variable delay circuit 505 are fixed and the delay amount of the common variable delay circuit 500 is varied. In this manner, the test apparatus 10 obtains a delay amount Ta of the common variable delay circuit 500 which enables the rising-side timing comparator 530 to obtain the rising signal at the timing corresponding to the varying point and a delay amount Tb of the common variable delay circuit 500 which enables the falling-side timing comparator 510 to obtain the rising signal at the timing corresponding to the varying point. Here, the output from one of the rising-side timing comparator 530 and falling-side timing comparator 510 which is not under measurement is fixed to zero through the reset input. Here, a result of Ta>Tb indicates TpLH<TpHL. This means that when rising and falling signals are output at the same timing, the rising signal arrives at the rising-side timing comparator 530 and falling-side timing comparator 510 before the falling signal does. On the other hand, a result of Ta<Tb indicates TpLH>TpHL. This means that, when rising and falling signals are output at the same timing, the rising signal arrives at the rising-side timing comparator 530 and falling-side timing comparator 510 after the falling signal does.

FIGS. 3A to 3D are first diagrams illustrating the timing comparing method utilized by the timing comparing section 470.

In the case of TpLH<TpHL, the rising-side strobe signal STRB_LH output from the rising-side variable delay circuit 520 rises before the falling-side strobe signal STRB_HL output from the falling-side variable delay circuit 505 does. In this case, to enable the rising edge of the device output signal HSENSE to be detected by means of the rising-side strobe signal STRB_LH and to enable the falling edge to be detected by means of the falling-side strobe signal STRB_HL, the comparison result selecting circuit 580 may output the output from the AND gate 560 to the logic comparing section 480 with the value of the comparison result selecting signal being set at one as discussed in the following.

Figure 3A:
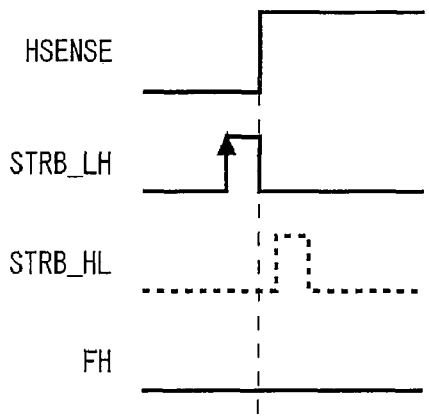
FIGS. 3A to 3D are first diagrams illustrating a timing comparing method utilized by the timing comparing section 470.
Figure 3B:
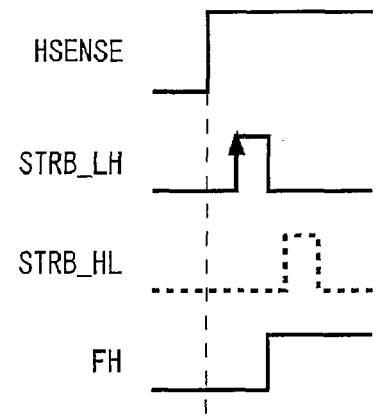

When the device output signal HSENSE rises, the timing comparing section 470 needs to output, to the logic comparing section 480, a result obtained in such a manner that the rising-side timing comparator 530 obtains the device output signal HSENSE. Here, when the output QLH from the rising-side timing comparator 530 indicates the logical value L, the output QHL from the falling-side timing comparator 510 indicates the logical value L or H depending on the relative relation along the time axis between the device output signal HSENSE and falling-side strobe signal STRB_HL (FIG. 3A). On the other hand, when the output QLH from the rising-side timing comparator 530 indicates the logical value H, the output QHL from the falling-side timing comparator 510 indicates the logical value H since the device output signal HSENSE is obtained by the falling-side strobe signal STRB_HL which follows the rising-side strove signal STRB_LH (FIG. 3B). As a result, the comparison result selecting circuit 580 can output the comparison result signal FH determined in accordance with the output from the rising-side timing comparator 530, to the logic comparing section 480, by selecting the AND gate 560 which outputs the logical AND between the outputs from the rising-side timing comparator 530 and falling-side timing comparator 510.

Figure 3C:
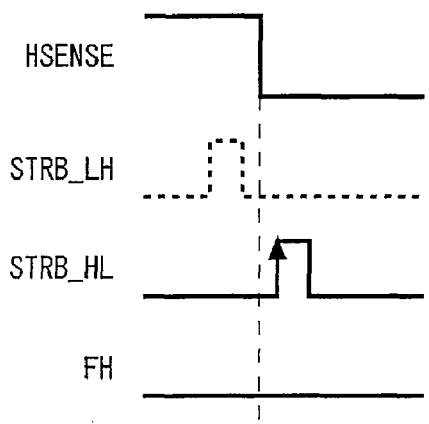
Figure 3D:
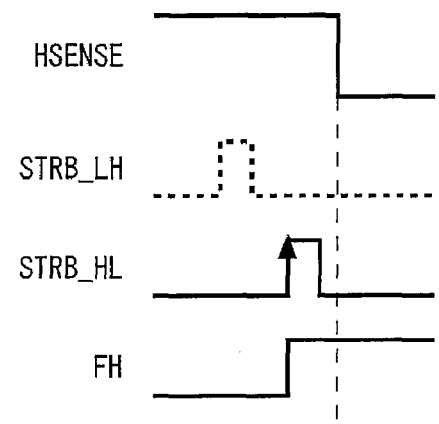

When the device output signal HSENSE falls, the timing comparing section 470 needs to output, to the logic comparing section 480, a result obtained in such a manner that the falling-side timing comparator 510 obtains the device output signal HSENSE. Here, when the output QHL from the falling-side timing comparator 510 indicates the logical value L, the output QLH from the rising-side timing comparator 530 indicates the logical value L or H depending on the relative relation along the time axis between the device output signal HSENSE and rising-side strobe signal STRB_LH (FIG. 3C). On the other hand, when the output QHL from the falling-side timing comparator 510 indicates the logical value H, the output QLH from the rising-side timing comparator 530 indicates the logical value H since the device output signal HSENSE is obtained by the rising-side strobe signal STRB_LH which precedes the falling-side strobe signal STRB_HL (FIG. 3D). As a result, the comparison result selecting circuit 580 can output the comparison result signal FH determined in accordance with the output from the rising-side timing comparator 530, to the logic comparing section 480, by selecting the AND gate 560 which outputs the logical AND between the outputs from the rising-side timing comparator 530 and falling-side timing comparator 510.

As discussed above, in the case of TpLH<TpHL, the comparison result selecting circuit 580 selects the output from the AND gate 560. In this way, the timing comparing section 470 can appropriately obtain the rising and falling edges of the device output signal HSENSE respectively by using the rising-side timing comparator 530 and falling-side timing comparator 510.

FIGS. 4A to 4D are second diagrams illustrating the timing comparing method utilized by the timing comparing section 470.

In the case of TpLH>TpHL, the rising-side strobe signal STRB_LH output from the rising-side variable delay circuit 520 rises after the falling-side strobe signal STRB_HL output from the falling-side variable delay circuit 505 does. In this case, to enable the rising edge of the device output signal HSENSE to be detected by means of the rising-side strobe signal STRB_LH and to enable the falling edge to be detected by means of the falling-side strobe signal STRB_HL, the comparison result selecting circuit 580 may output the output from the OR gate 570 to the logic comparing section 480 with the value of the comparison result selecting signal being set at zero as discussed in the following.

Figure 4A:
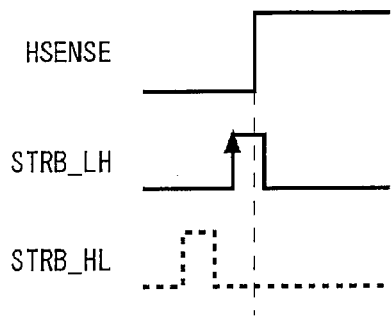
FIGS. 4A to 4D are second diagrams illustrating a timing comparing method utilized by the timing comparing section 470.
Figure 4B:
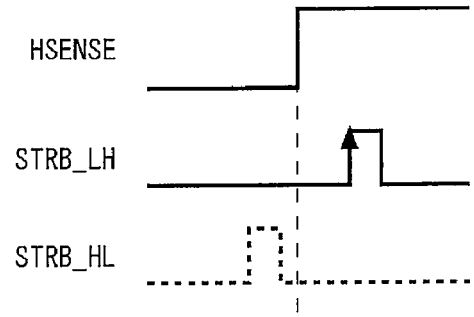

When the device output signal HSENSE rises, the timing comparing section 470 needs to output, to the logic comparing section 480, a result obtained in such a manner that the rising-side timing comparator 530 obtains the device output signal HSENSE. Here, when the output QLH from the rising-side timing comparator 530 indicates the logical value L, the output QHL from the falling-side timing comparator 510 indicates the logical value L since the device output signal HSENSE is obtained by the falling-side strobe signal STRB_HL which precedes the rising-side strobe signal STRB_H (FIG. 4A). On the other hand, when the output QLH from the rising-side timing comparator 530 indicates the logical value H, the output QHL from the falling-side timing comparator 510 indicates the logical value L or H depending on the relative relation along the time axis between the device output signal HSENSE and falling-side strobe signal STRB_HL (FIG. 4B). As a result, the comparison result selecting circuit 580 can output the comparison result signal FH determined in accordance with the output from the rising-side timing comparator 530, to the logic comparing section 480, by selecting the OR gate 570 which outputs the logical OR between the outputs from the rising-side timing comparator 530 and falling-side timing comparator 510.

Figure 4C:
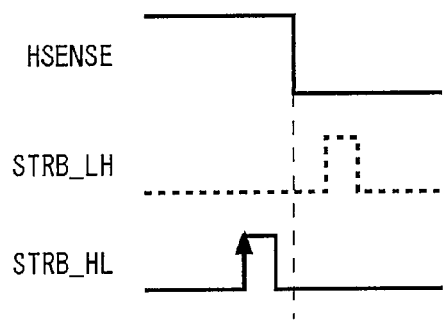
Figure 4D:
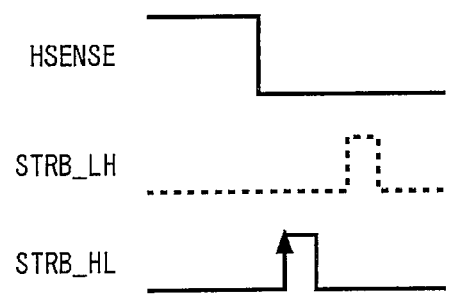

When the device output signal HSENSE falls, the timing comparing section 470 needs to output, to the logic comparing section 480, a result obtained in such a manner that the falling-side timing comparator 510 obtains the device output signal HSENSE. Here, when the output QHL from the falling-side timing comparator 510 indicates the logical value H, the output QLH from the rising-side timing comparator 530 indicates the logical value L or H depending on the relative relation along the time axis between the device output signal HSENSE and rising-side strobe signal STRB_LH (FIG. 4C). On the other hand, when the output QHL from the falling-side timing comparator 510 indicates the logical value L, the output QLH from the rising-side timing comparator 530 indicates the logical value H since the device output signal HSENSE is obtained by the rising-side strobe signal STRB_LH which follows the falling-side strobe signal STRB_HL (FIG. 4D). As a result, the comparison result selecting circuit 580 can output the comparison result signal FH determined in accordance with the output from the falling-side timing comparator 510, to the logic comparing section 480, by selecting the AND gate 560 which outputs the logical OR between the outputs from the rising-side timing comparator 530 and falling-side timing comparator 510.

As discussed above, in the case of TpLH>TpHL, the comparison result selecting circuit 580 selects the output from the OR gate 570. In this way, the timing comparing section 470 can appropriately obtain the rising and falling edges of the device output signal HSENSE respectively by using the rising-side timing comparator 530 and falling-side timing comparator 510.

Figure 5:
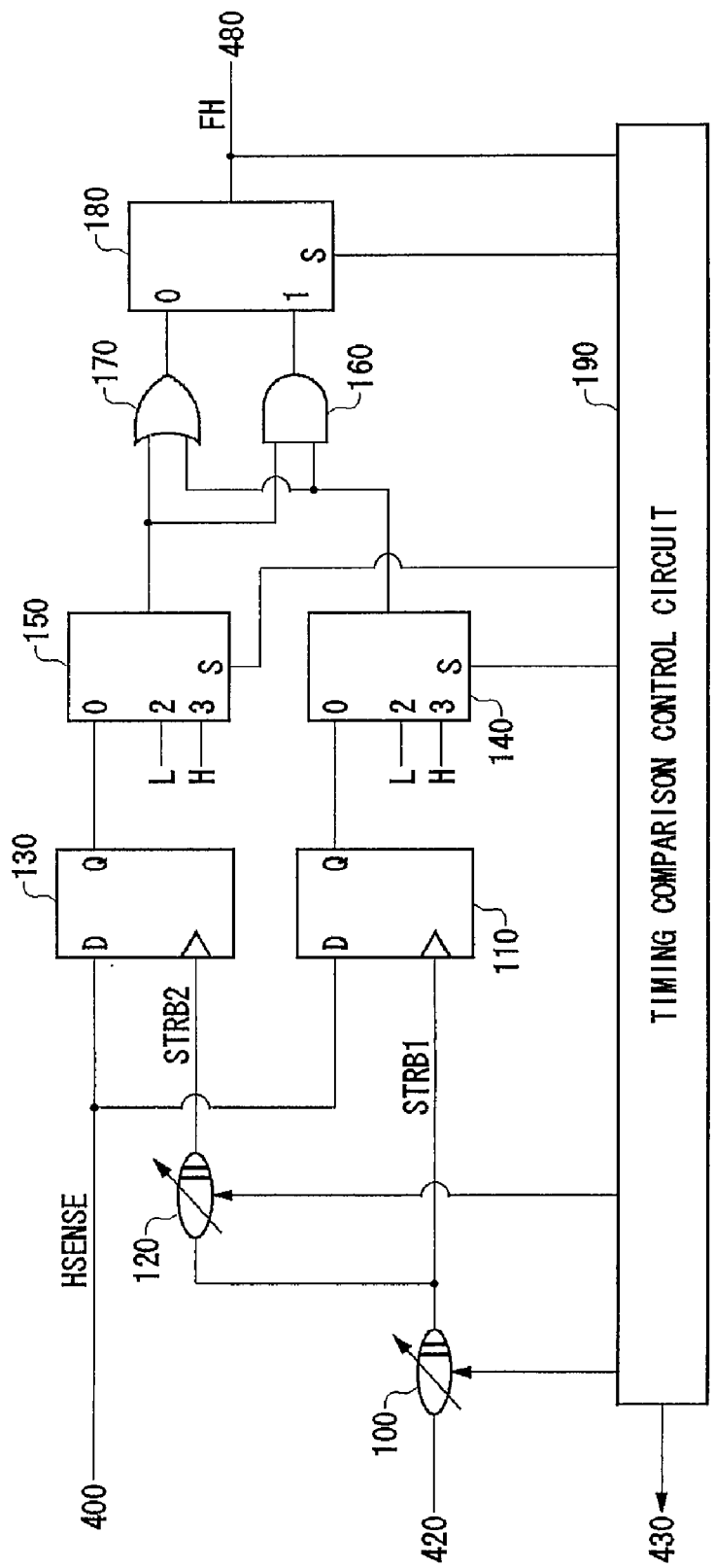
FIG. 5 illustrates the configuration of the timing comparing section 470 relating to an embodiment of the present invention.

FIG. 5 illustrates the configuration of the timing comparing section 470 in the test apparatus 10 relating to the present embodiment. The timing comparing section 470 relating to the present embodiment is obtained by omitting the falling-side variable delay circuit 505 from the timing comparing section 470 shown in FIG. 1, and thus has a smaller circuit scale than the timing comparing section 470 shown in FIG. 1. However, the timing comparing section 470 relating to the present embodiment still appropriately obtains the rising and falling edges of the device output signal. The timing comparing section 470 relating to the present embodiment includes therein, a first variable delay circuit 100, a first timing comparator 110, a second variable delay circuit 120, a second timing comparator 130, a first selector 140, a second selector 150, an AND gate 160, an OR gate 170, a comparison result selecting circuit 180, and a timing comparison control circuit 190.

The first variable delay circuit 100 outputs a first strobe signal STRB1 which is generated by delaying, by a predetermined time, a pulse signal which is input thereto from the timing generator 420 and used as a reference for timing comparison. The first timing comparator 110 obtains the device output signal at a timing designated by the first strobe signal output from the first variable delay circuit 100. The second variable delay circuit 120 outputs a second strobe signal STRB2 which is generated by delaying, by a predetermined time, the first strobe signal. The second timing comparator 130 obtains the device output signal at a timing designated by the second strobe signal.

The first selector 140 is connected so as to be positioned between the first timing comparator 110 and the AND and OR gates 160 and 170. The first selector 140 selects, in accordance with a selecting signal from the timing comparison control circuit 190, to input the output from the first timing comparator 110 into the AND and OR gates 160 and 170, mask the output from the first timing comparator 110 and input a signal indicating the logical value L into the AND and OR gates 160 and 170, or mask the output from the first timing comparator 110 and input a signal indicating the logical value H into the AND and OR gates 160 and 170.

The second selector 150 is connected so as to be positioned between the second timing comparator 130 and the AND and OR gates 160 and 170. The second selector 150 selects to input the output from the second timing comparator 130 into the AND and OR gates 160 and 170, mask the output from the second timing comparator 130 and input a signal indicating the logical value L into the AND and OR gates 160 and 170, or mask the output from the second timing comparator 130 and input a signal indicating the logical value H into the AND and OR gates 160 and 170. Here, the wirings from the first timing comparator 110 and second timing comparator 130 to the first selector 140 and second selector 150 may be longer than the wiring from the second selector 150 to the AND and OR gates 160 and 170. In this way, a change in the electrical characteristics of the timing comparing section 470 which may be caused by fixing the output from the first selector 140 or second selector 150 to indicate the logical value L or H can be reduced, when compared with a case where the first and second selectors 140 and 150 are provided in the vicinity of the first and second timing comparators 110 and 130.

The AND gate 160 outputs a logical AND between the outputs from the first timing comparator 110 and second timing comparator 130. The OR gate 170 outputs a logical OR between the outputs from the first timing comparator 110 and second timing comparator 130. The comparison result selecting circuit 180 selects one of the outputs from the AND gate 160 and OR gate 170 in accordance with the comparison result selecting signal received from the timing comparison control circuit 190, and outputs the selected one to the logic comparing section 480.

The timing comparison control circuit 190 controls the constituents of the timing comparing section 470 so as to adjust the phases of the rising and falling edges of the device output signal. The timing comparison control circuit 190 determines the value of the comparison result selecting signal which is to be input into the comparison result selecting circuit 180 during the test of the DUT 400, in accordance with the times required for the transmission of the rising and falling signals.

Figure 6:
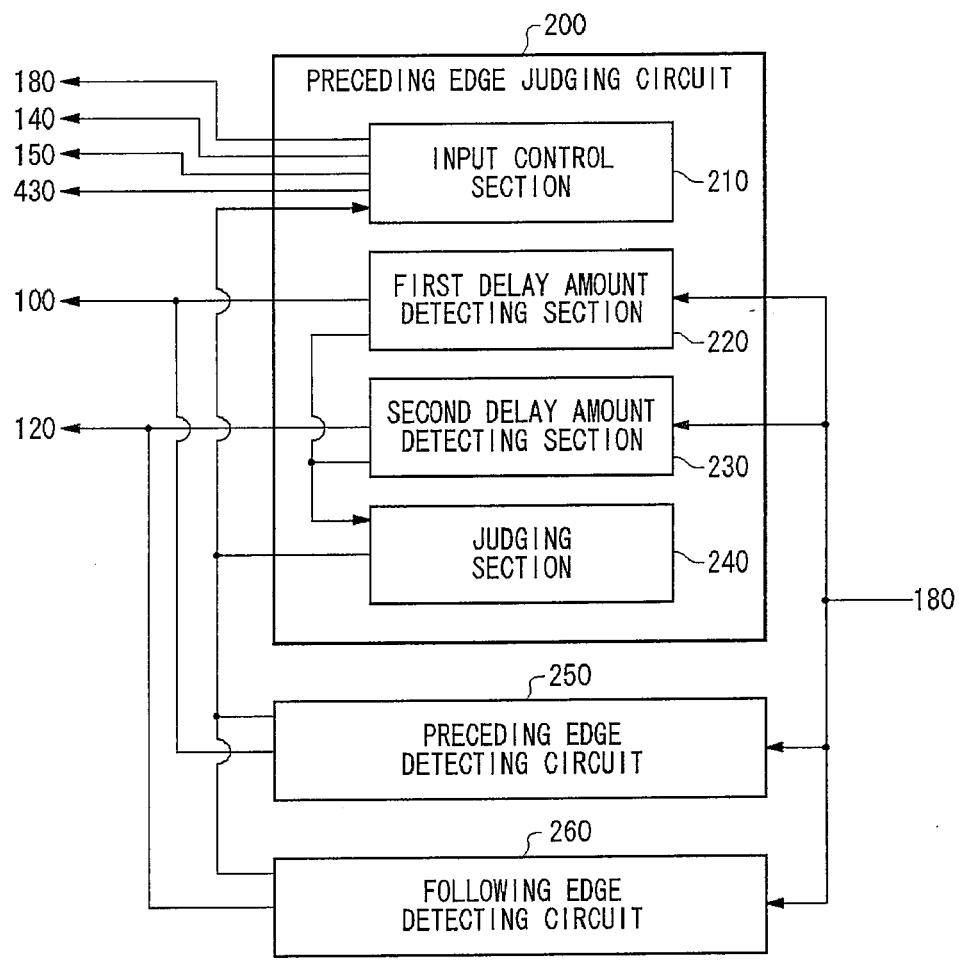
FIG. 6 illustrates the configuration of a timing comparison control circuit 190 relating to an embodiment of the present invention.

FIG. 6 illustrates the configuration of the timing comparison control circuit 190 relating to the present embodiment. The timing comparison control circuit 190 includes therein a preceding edge judging circuit 200, a preceding edge detecting circuit 250, and a following edge detecting circuit 260.

The preceding edge judging circuit 200 judges, when rising and falling signals are input at the same timing as the device output signal, which one of the rising and falling signals arrives at the first and second timing comparators 110 and 130 at an earlier timing. Here, the preceding edge judging circuit 200 includes therein an input control section 210, a first delay amount detecting section 220, a second delay amount detecting section 230, and a judging section 240.

The input control section 210 determines the settings for the first selector 140, second selector 150 and comparison result selecting circuit 180 for the above-mentioned judgment. After this, the input control section 210 instructs the pattern generator 430 to input the device output signal repeatedly into the timing comparing section 470 via the contact point between the timing comparing section 470 and the DUT 400. The first delay amount detecting section 220 detects such (a) delay amount(s) of the first variable delay circuit 100 and/or second variable delay circuit 120 that one of the first and second tiring comparators 110 and 130 obtains the rising signal which is repeatedly input as the device output signal at the timing of the rising edge. The second delay amount detecting section 230 detects such (a) delay amount(s) of the first variable delay circuit 100 and/or second variable delay circuit 120 that the same one of the first and second timing comparators 110 and 130 obtains the falling signal which is repeatedly input as the device output signal at the timing of the falling edge. The judging section 240 calculates the relative relation along the time axis between the arrival timings of the rising and falling signals, based on the delay amounts which enable the above-mentioned one of the first and second timing comparators 110 and 130 to obtain the device output signal at the timings of the rising and falling edges.

The preceding edge detecting circuit 250 adjusts the delay amount of the first variable delay circuit 100 so that the first timing comparator 110 obtains one of the rising and falling signals which is judged by the preceding edge judging circuit 200 to arrive earlier at the timing of the rising or falling edge. The following edge detecting circuit 260 adjusts the delay amount of the second variable delay circuit 120 so that the second timing comparator 130 obtains one of the rising and falling signals which is judged by the preceding edge judging circuit 200 to arrive later at the timing of the rising or falling edge.

According to the timing comparing section 470 described above with reference to FIGS. 5 and 6, the first timing comparator 110 obtains one of the rising and falling signals which has a shorter transmission time, and the second timing comparator 130 obtains one of the rising and falling signals which has a longer transmission time. In this way, the strobe signal STRB1 for the first timing comparator 110 always precedes the strobe signal STRB2 for the second timing comparator 130. As a result, the timing comparing section 470 can obtain the rising and falling signals at appropriate timings which are determined in accordance with the relative relation between the transmission times and output the obtained results to the logic comparing section 480, without requiring a delay circuit to be provided between the first variable delay circuit 100 and first timing comparator 110.

Figure 7:
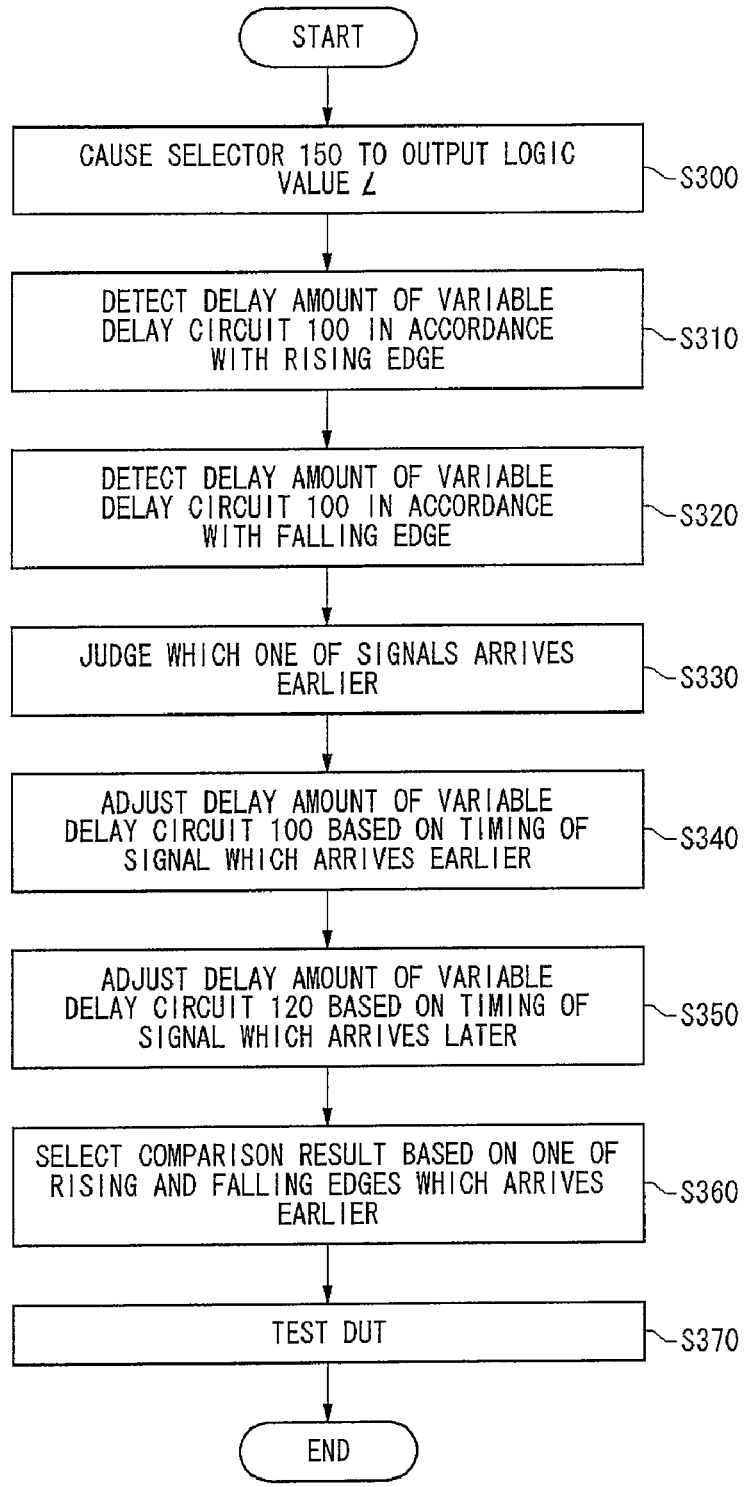
FIG. 7 is a flow chart illustrating the operation performed by a test apparatus 10 relating to an embodiment of the present invention.
Figure 8:
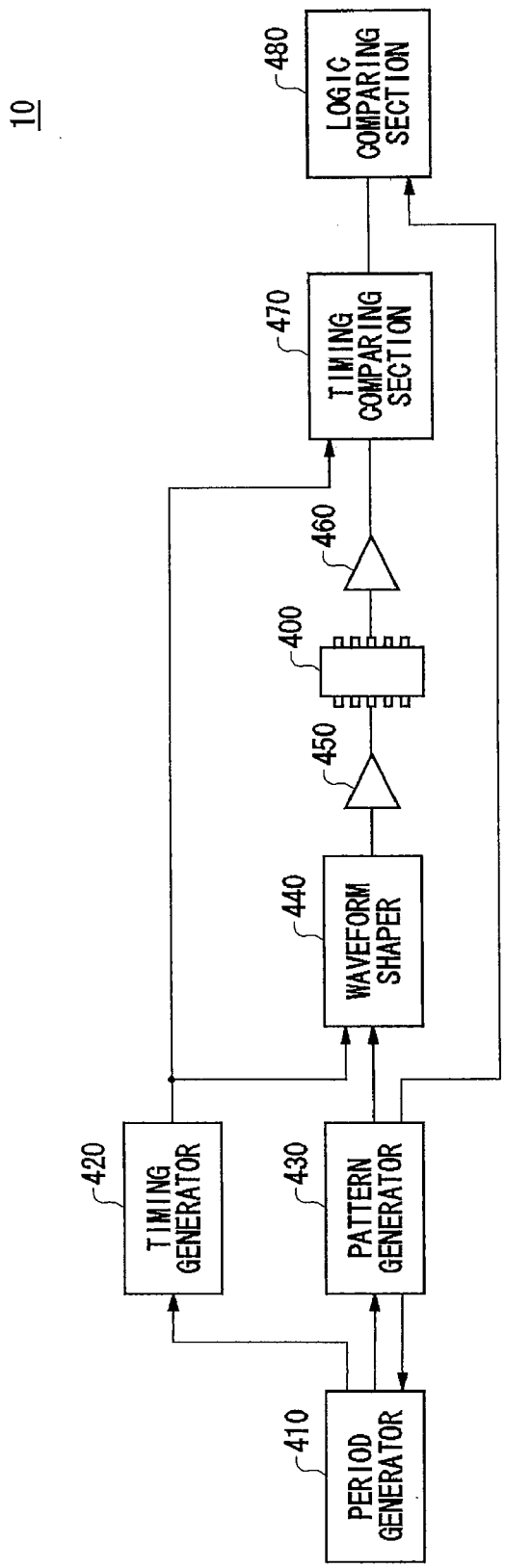
FIG. 8 illustrates the configuration of the test apparatus 10.

FIG. 7 is a flow chart illustrating the operations performed by the test apparatus 10 relating to the present embodiment.

To begin with, the timing comparison control circuit 190 performs the operations in the steps S300 to S330 to judge, when the rising and falling edges are output at the same timing, which one of the rising and falling edges arrives earlier at the first timing comparator 110 and second timing comparator 130. To be specific, the input control section 210 of the timing comparison control circuit 190 outputs a selecting signal "2" to the second selector 150 to cause the second selector 150 to mask the output from the second timing comparator 130 and output the signal indicating the logical value L. Also, the input control section 210 outputs a selecting signal "0" to the first selector 140 to cause the first selector 140 to select the output from the first timing comparator 110 and output the selected output to the AND gate 160 and OR gate 170. Furthermore, the input control section 210 outputs a comparison result selecting signal "0" to the comparison result selecting circuit 180 to cause the comparison result selecting circuit 180 to select the output from the OR gate 170. In this way, the output from the first timing comparator 110 is output to the logic comparing section 480 via the OR gate 170 and comparison result selecting circuit 180. While the above settings are kept, the input control section 210 instructs the pattern generator 430 to supply the device output signal for an adjustment use. As a result, the pattern generator 430 repeatedly inputs the rising signal as the device output signal into the timing comparing section 470 (step S300).

Subsequently, the first delay amount detecting section 220 causes the first timing comparator 110 to sequentially obtain the rising signal which is repeatedly input, while varying the delay amount of the first variable delay circuit 100. The first delay amount detecting section 220 receives, through the comparison result selecting circuit 180, the result of obtaining the rising signal which is output from the first timing comparator 110, and detects a first delay amount of the first variable delay circuit 100 which enables the first timing comparator 110 to obtain the rising signal at the timing of the rising edge, in a similar manner to the method described with reference to FIGS. 2A and 2B (step S310).

After this, the second delay amount detecting section 230 causes the first timing comparator 110 to sequentially obtain the falling signal which is repeatedly input, while varying the delay amount of the first variable delay circuit 100. The first delay amount detecting section 220 receives, through the comparison result selecting circuit 180, the result of obtaining the falling signal which is output from the first timing comparator 110, and detects a second delay amount of the first variable delay circuit 100 which enables the first timing comparator 110 to obtain the falling signal at the timing of the falling edge, in a similar manner to the method described with reference to FIGS. 2A and 2B (step S320).

Subsequently, the judging section 240 compares the first and second delay amounts to each other, to judge which one of the rising and falling signals arrives earlier when the rising and falling signals are input at the same timing (step S330). When the first delay amount is smaller than the second delay amount, the judging section 240 judges that the rising signal arrives at an earlier timing than the falling signal. When the first delay amount is larger than the second delay amount, the judging section 240 judges that the rising signal arrives at a later timing than the falling signal.

After this, the preceding edge detecting circuit 250 adjusts the delay amount of the first variable delay circuit 100 so that the first timing comparator 110 obtains one of the rising and falling signals which is judged to arrive earlier at the timing of the rising or falling edge (step S340). According to the present embodiment, the operations performed in the steps S310 to S330 already detect the delay amounts of the first variable delay circuit 100 which are associated with the timings of the signals which arrive earlier and later. Therefore, the preceding edge detecting circuit 250 may adjust the delay amount of the first variable delay circuit 100 by selecting a smaller one of the first and second delay amounts respectively detected in the steps S310 and S320 as the delay amount of the first variable delay circuit 100 which is associated with the timing of the signal which arrives earlier.

Alternatively, the preceding edge detecting circuit 250 may perform the following adjustment operation. To begin with, the preceding edge detecting circuit 250 instructs the input control section 210 to cause one of the rising and falling signals which is judged to arrive earlier to be input as the device output signal for an adjustment use. In response to this instruction, the input control section 210 causes the second selector 150 to select the signal indicating the logical value L, and causes the comparison result selecting circuit 180 to select the output from the OR gate 170. Subsequently, the input control section 210 instructs the pattern generator 430 to input one of the rising and falling signals which is judged to arrive earlier as the device output signal for an adjustment use. The preceding edge detecting circuit 250 adjusts the delay amount of the first variable delay circuit 100 so that the first timing comparator 110 obtains the device output signal for an adjustment use at the timing of the rising or falling edge.

After this, the following edge detecting circuit 260 adjusts the delay amount of the second variable delay circuit 120 so that the second timing comparator 130 obtains one of the rising and falling signals which is judged to arrive later at the timing of rising or falling edge (step S350). According to the present embodiment, the operations performed in the steps S310 to S330 judge which one of the rising and falling signals arrives earlier by varying the delay amount of the first variable delay circuit 100. The following edge detecting circuit 260 relating to the present embodiment adjusts the delay amount of the second variable delay circuit 120 in accordance with the following adjustment operation.

The following edge detecting circuit 260 instructs the input control section 210 to cause one of the rising and falling signals which is judged to arrive later to be input as the device output signal for an adjustment use. In response to this instruction, the input control section 210 causes the first selector 140 to select the signal indicating the logical value L, and causes the comparison result selecting circuit 180 to select the output from the OR gate 170. Subsequently, the input control section 210 instructs the pattern generator 430 to input one of the rising and falling signals which is judged to arrive later as the device output signal for an adjustment use. The following edge detecting circuit 260 adjusts the delay amount of the second variable delay circuit 120 so that the second timing comparator 130 obtains the device output signal for an adjustment use at the timing of the rising or falling edge.

After this, prior to the test of the DUT 400, the input control section 210 determines the value of the comparison result selecting signal to be supplied to the comparison result selecting circuit 180, depending on which one of the rising and falling signals for an adjustment use arrives earlier at the first and second timing comparators 110 and 130 (step S360). When the rising signal is judged to arrive earlier than the falling signal, the comparison result selecting circuit 180 selects the output from the AND gate 160 as the timing comparison result FH which is obtained based on the device output signal during the test. On the other hand, when the falling signal is judged to arrive earlier than the rising signal, the comparison result selecting circuit 180 selects the output from the OR gate 170 as the timing comparison result FH which is obtained based on the device output signal during the test. After conducting the phase adjustment in the above-described manner, the test apparatus 10 tests the DUT 400 (step S370).

By performing the above-described operations, the timing comparing section 470 can obtain, at the first timing comparator 110, one of the rising and falling signals which has a shorter transmission time, and obtain, at the second timing comparator 130, one of the rising and falling signals which has a longer transmission time. When the first timing comparator 110 obtains the rising signal and the second timing comparator 130 obtains the falling signal, the first strobe signal STRB1 for the rising signal precedes the second strobe signal STRB2 for the falling signal. Therefore, the timing comparing section 470 can output the output from the AND gate 160 as the timing comparison result FH as described with reference to FIGS. 3A to 3D. On the other hand, when the first timing comparator 110 obtains the falling signal and the second timing comparator 130 obtains the rising signal, the first strobe signal STRB1 for the rising signal follows the second strobe signal STRB2 for the falling signal. Therefore, the timing comparing section 470 can output the output from the OR gate 170 as the timing comparison result FH as described with reference to FIGS. 4A to 4D.

While the embodiment of the present invention has been described, the technical scope of the invention is not limited to the above described embodiment. It is apparent to persons skilled in the art that various alternations and improvements can be added to the above-described embodiment. It is also apparent from the scope of the claims that the embodiment added with such alternations or improvements can be included in the technical scope of the invention.

For example, the timing comparing section 470 judges which one of the rising and falling signals arrives earlier based on the delay amounts of the first variable delay circuit 100 which enable the first timing comparator 110 to obtain the rising and falling signals at the timings of their varying points in the steps S300 to S330 shown in FIG. 7. Alternatively, the timing comparing section 470 may judge which one of the rising and falling signals arrives earlier based on the delay amounts of the first variable delay circuit 100 and/or second variable delay circuit 120 which enable the second timing comparator 130 to obtain the rising and falling signals at the timings of their varying points.

In order to cause the comparison result selecting circuit 180 to output the output from one of the first timing comparator 110 and second timing comparator 130, the timing comparison control circuit 190 causes one of the second selector 150 and first selector 140 which is connected to the other one of the first timing comparator 110 and second timing comparator 130 to select the logical value L, and causes the comparison result selecting circuit 180 to select the output from the OR gate 170. Alternatively, the timing comparison control circuit 190 may cause one of the second selector 150 and first selector 140 which is connected to the other one of the first timing comparator 110 and second timing comparator 130 to select the logical value H, and causes the comparison result selecting circuit 180 to select the output from the AND gate 160.

As clearly indicated by the above description, one embodiment of the present invention can provide a test apparatus and a test method which can efficiently adjust a phase difference between a rising signal and a falling signal output from a DUT which may be caused during transmission of the signals and obtain the adjusted rising and falling signals.

What is claimed is:

1. A test apparatus for testing a device under test, comprising:
    a first timing comparator that obtains a device output signal output from the device under test at a timing designated by a first strobe signal;
    a second timing comparator that obtains the device output signal at a timing designated by a second strobe signal, the second strobe signal being supplied later than the first strobe signal;
    a preceding edge judging circuit that, when a rising signal and a falling signal are input at the same timing as the device output signal, judges which one of the rising and falling signals arrives at the first and second timing comparators at an earlier timing;
    a preceding edge detecting circuit that adjusts a timing at which the first strobe signal is supplied so that the first timing comparator obtains, at a timing of a rising or falling edge, one of the rising and falling signals which is judged to arrive earlier; and
    a following edge detecting circuit that adjusts a timing at which the second strobe signal is supplied so that the second timing comparator obtains, at a timing of a rising or falling edge, one of the rising and falling signals which is judged to arrive later.

2. The test apparatus as set forth in claim 1, further comprising:
    a first variable delay circuit that outputs the first strobe signal which is generated by delaying a reference pulse signal;
    a second variable delay circuit that outputs the second strobe signal which is generated by delaying the first strobe signal, wherein
    the preceding edge detecting circuit adjusts a delay amount of the first variable delay circuit so that the first timing comparator obtains, at the timing of the rising or falling edge, one of the rising and falling signals which is judged to arrive earlier, and
    the following edge detecting circuit adjusts a delay amount of the second variable delay circuit so that the second timing comparator obtains, at the timing of the rising or falling edge, one of the rising and falling signals which is judged to arrive later.

3. The test apparatus as set forth in claim 2, further comprising:
    an AND gate that outputs a logical AND between an output from the first timing comparator and an output from the second timing comparator;
    an OR gate that outputs a logical OR between the output from the first timing comparator and the output from the second timing comparator; and
    a comparison result selecting circuit that, as a timing comparison result which is obtained based on the device output signal during a test, (i) selects the output from the AND gate when the rising signal is judged to arrive earlier than the falling signal, and (ii) selects the output from the OR gate when the falling signal is judged to arrive earlier than the rising signal.

4. The test apparatus as set forth in claim 2, wherein
    the preceding edge detecting circuit causes one of the rising and falling signals which is judged to arrive earlier to be input as the device output signal for an adjustment use, and adjusts the delay amount of the first variable delay circuit so that the first timing comparator obtains the device output signal for an adjustment use at the timing of the rising or falling edge.

5. The test apparatus as set forth in claim 2, wherein
    the following edge detecting circuit causes one of the rising and falling signals which is judged to arrive later to be input as the device output signal for an adjustment use, and adjusts the delay amount of the second variable delay circuit so that the second timing comparator obtains the device output signal for an adjustment use at the timing of the rising or falling edge.

6. The test apparatus as set forth in claim 3, further comprising:
    a first selector that is connected so as to be positioned between the first timing comparator and the AND and OR gates, the first selector selecting to (i) input the output from the first timing comparator into the AND and OR gates or (ii) mask the output from the first timing comparator and input a signal indicating a logical value L into the AND and OR gates; and
    a second selector that is connected so as to be positioned between the second timing comparator and the AND and OR gates, the second selector selecting to (I) input the output from the second timing comparator into the AND and OR gates or (II) mask the output from the second timing comparator and input a signal indicating a logical value L into the AND and OR gates.

7. The test apparatus as set forth in claim 6, wherein
    in such a state that the preceding edge detecting circuit causes the second selector to select the signal indicating the logical value L and causes the comparison result selecting circuit to select the output from the OR gate, the preceding edge detecting circuit adjusts the delay amount of the first variable delay circuit while one of the rising and falling signals which is judged to arrive earlier is input as the device output signal for an adjustment use, and in such a state that the following edge detecting circuit causes the first selector to select the signal indicating the logical value L and causes the comparison result selecting circuit to select the output from the OR gate, the following edge detecting circuit adjusts the delay amount of the second variable delay circuit while one of the rising and falling signals which is judged to arrive later is input as the device output signal for an adjustment use.

8. The test apparatus as set forth in claim 6, wherein the preceding edge judging circuit includes:

an input control section that causes the device output signal to be input repeatedly while causing the second selector to mask the output from the second timing comparator and output the signal indicating the logical value L and causing the comparison result selecting circuit to select the output from the OR gate;

a first delay amount detecting section that, by causing the first timing comparator to sequentially obtain the rising signal which is repeatedly input while varying the delay amount of the first variable delay circuit, detects a first delay amount of the first variable delay circuit which enables the first timing comparator to obtain the rising signal at the timing of the rising edge;

a second delay amount detecting section that, by causing the first timing comparator to sequentially obtain the falling signal which is repeatedly input while varying the delay amount of the first variable delay circuit, detects a second delay amount of the first variable delay circuit which enables the first timing comparator to obtain the falling signal at the timing of the falling edge; and a judging section that judges that the rising signal arrives earlier than the falling signal when the first delay amount is smaller than the second delay amount, and judges that the rising signal arrives later than the falling signal when the first delay amount is larger than the second delay amount.

9. The test apparatus as set forth in claim 8, wherein the delay amount of the first variable delay circuit is set by the preceding edge detecting circuit so as to be equal to a smaller one of the first and second delay amounts.

10. The test apparatus as set forth in claim 6, wherein wirings from the first and second timing comparators to the first and second selectors are longer than wirings from the first and second selectors to the AND and OR gates.

11. The test apparatus as set forth in claim 3, further comprising:

a first selector that is connected so as to be positioned between the first timing comparator and the AND and OR gates, the first selector selecting to (i) input the output from the first timing comparator into the AND and OR gates or (ii) mask the output from the first timing comparator and input a signal indicating a logical value H into the AND and OR gates; and a second selector that is connected so as to be positioned between the second timing comparator and the AND and OR gates, the second selector selecting to (I) input the output from the second timing comparator into the AND and OR gates or (II) mask the output from the second timing comparator and input a signal indicating a logical value H into the AND and OR gates.

12. The test apparatus as set forth in claim 11, wherein in such a state that the preceding edge detecting circuit causes the second selector to select the signal indicating the logical value H and causes the comparison result selecting circuit to select the output from the AND gate, the preceding edge detecting circuit adjusts the delay amount of the first variable delay circuit while one of the rising and falling signals which is judged to arrive earlier is input as the device output signal for an adjustment use, and in such a state that the following edge detecting circuit causes the first selector to select the signal indicating the logical value H and causes the comparison result selecting circuit to select the output from the AND gate, the following edge detecting circuit adjusts the delay amount of the second variable delay circuit while one of the rising and falling signals which is judged to arrive later is input as the device output signal for an adjustment use.

13. A test method for testing a device under test, comprising:

obtaining a device output signal output from the device under test at a first timing designated by a first strobe signal;

obtaining the device output signal at a second timing designated by a second strobe signal, the second strobe signal being supplied later than the first strobe signal;

when a rising signal and a falling signal are input at the same timing as the device output signal, judging which one of the rising and falling signals arrives at the first and second timing comparators at an earlier timing;

adjusting the first timing designated by the first strobe signal so that one of the rising and falling signals which is judged to arrive earlier is obtained at a timing of a rising or falling edge; and adjusting the second timing designated by the second strobe signal so that one of the rising and falling signals which is judged to arrive later is obtained at a timing of a rising or falling edge.

* * * * *